United States Patent [19]

Forward

[11] 4,232,280
[45] Nov. 4, 1980

[54] NETWORK FOR SIMULATING LOW TEMPERATURE RESISTORS

[75] Inventor: Robert L. Forward, Oxnard, Calif.

[73] Assignee: Hughes Aircraft Company, Culver City, Calif.

[21] Appl. No.: 18,688

[22] Filed: Mar. 8, 1979

[51] Int. Cl.³ .............................................. H03H 11/52
[52] U.S. Cl. ................................... 333/213; 307/229; 307/324; 333/217
[58] Field of Search ................................ 333/213, 217

[56] References Cited

U.S. PATENT DOCUMENTS

| | | | |
|---|---|---|---|
| 2,864,062 | 12/1958 | Schaffner | 333/217 |
| 3,828,281 | 8/1974 | Chambers, Jr. | 333/217 X |
| 3,899,693 | 8/1975 | Gaudreault | 307/237 X |
| 4,041,407 | 8/1977 | Main | 330/268 |
| 4,156,859 | 5/1979 | Forward et al. | 333/213 |

Primary Examiner—Paul L. Gensler
Attorney, Agent, or Firm—William J. Benman, Jr.; W. H. MacAllister

[57] ABSTRACT

A class of two-terminal active networks which simulate low-noise temperature resistors is disclosed. A single field effect transistor or other suitable amplifier comprises the active element of the network. A dual transformer feedback arrangement or a single transformer feedback arrangement comprises the remainder of the circuit. Either positive or negative simulated resistors can be obtained with a wide range of equivalent resistance values and effective noise temperatures.

6 Claims, 6 Drawing Figures

Fig. 4.
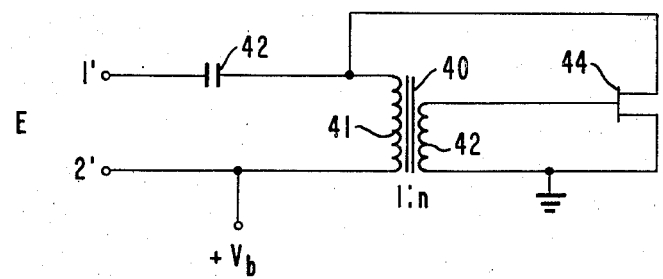
Fig. 5.
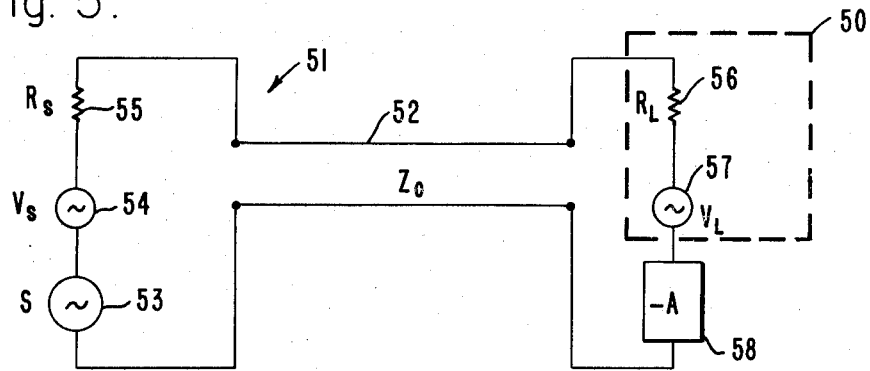
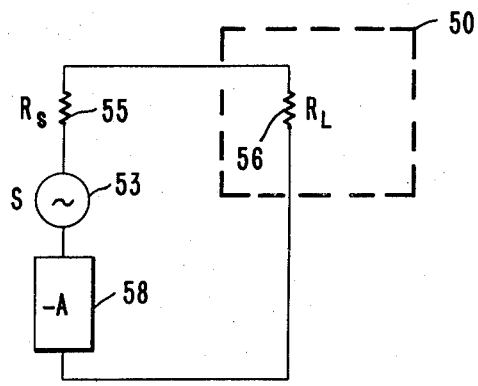
Fig. 6.

NETWORK FOR SIMULATING LOW TEMPERATURE RESISTORS

TECHNICAL FIELD

This invention relates to single-port electrical networks and more particularly to networks which simulate low-noise temperature resistors.

BACKGROUND ART

It has long been known that all electrical resistors are characterized by an inherent noise which is due to the thermal agitation of the free electrons within the resistor material. As used herein, the term "resistor", includes any body of material capable of carrying an electrical current. As such, the term embraces components such as wires and other conductors which are not ordinarily thought of as "resistors". If a signal current in the resistor or conductor is smaller than the random current due to thermal agitation then, as a practical matter, the signal is masked and no amount of amplification can separate them. This noise, known as "thermal noise", "Johnson noise" or "white noise", has heretofore generally been accepted as one of the limiting factors in the design of low-level signal processing circuits.

From the research of Johnson and Nyquist in the late 1928's, it is known that the thermal noise voltage across the open ends of a resistor is determined by the formula:

$$e_n^2 = 4kTRB \qquad [1]$$

Where $e_n^2$ is the average of the square of the noise voltage; k is Boltzmann's constant ($1.138 \times 10^{-23}$ joules per °K); T is the absolute temperature of the conductor in °K.; R is the resistor or conductor in ohms; and B is the bandwidth in Hertz over which the noise is measured.

In order to reduce the thermal noise of a given resistance R, it is seen from Equation [1] that either the temperature (T) or the bandwidth (B) must be reduced. To reduce B, of course, is generally not possible, since the operational bandwidth of a circuit is ordinarily predetermined and not susceptible to casual manipulation. In general, therefore, it has been the practice to minimize the thermal noise of a circuit by cooling the resistor or the entire circuit, in some cases to cryogenic temperatures. However, since the noise voltage is proportional to the square root of the absolute temperature, it is readily appreciated that it is both costly and cumbersome to provide the degree of cooling required to achieve a significant reduction in thermal noise.

It is therefore an object of the present invention to provide a non-cryogenically cooled low-noise temperature resistance.

In 1939, it was suggested by W. S. Percival that a simulated resistor having an effective noise temperature lower than ambient temperature could be realized by feedback means. (See: W. S. Percival, "An Electrically 'Cold' Resistance", The Wireless Engineer, Vol. 16, May 1939, pp. 237-240). By utilizing a single transformer between the plate and grid of a vacuum tube amplifier, Percival simulated a resistance having an effective temperature of 70° K. The same technique was later expanded upon by Strutt and Van der Ziel in an article entitled, "Suppression of Spontaneous Fluctuations in Amplifiers and Receiver for Electrical Communication and For Measuring Devices," Physica, Vol. 9, No. 6, June 1942, pp. 513-527. Professor Van der Ziel also briefly summarized the techniques in his treatise "Noise," Prentice-Hall, New York, N.Y., 1954, pp. 262 et seq. (See also: U.S. Pat. No. 2,352,956 which issued to M. J. O. Strutt, et al. on July 4, 1944.)

The circuits of the prior art appear to have received little attention in the several decades since their introduction. This may be due to the many shortcomings inherent in the use of vacuum tubes such as their high operating temperatures and the other sources of noise inherent therein. In any event, advances in solid state technology have produced a number of sophisticated, highly efficient, low-cost active devices which allow the synthesis of economical low-noise temperature resistance simulating circuits.

It is therefore another object of the present invention to provide an active circuit which simulates a low-noise resistor.

A recent attempt at reducing circuit noise by feedback means is illustrated in U.S. Pat. No. 3,839,686 which was issued to W. Vogel on Oct. 1, 1974. According to the teachings of that invention, the induced voltage on a transmission line such as a coaxial cable can be decreased by a feedback control circuit which includes an amplifier. Although the circuit of the Vogel patent does not simulate a resistance, either low-noise or otherwise, it does represent an example of noise reduction employing feedback techniques.

More recent techniques for simulating low-noise temperature resistors have been suggested in copending U.S. Patent Applications: Ser. No. 838,511, filed Oct. 3, 1977, now U.S. Pat. No. 4,156,859; and Ser. No. 881,296, filed Feb. 27, 1978, now U.S. Pat. No. 4,176,331. Another suggested circuit which utilizes a feedback amplifier as the active circuit element is described in a paper in Radio and Electronic Engineer, Vol. 42, No. 4, April 1972, pp. 163-171. In each of the several sources mentioned above, the circuits are unlike those of the present invention.

DISCLOSURE OF INVENTION

In keeping with the principles of the present invention, the above and other objects are accomplished in a single-port circuit by sensing the voltage across the terminals of the port and generating a current in the circuit port which is proportional to the impressed voltage. If the circuit is comprised of ideal components, then the resulting circuit is characterized by an equivalent resistance which obeys Ohm's Law (at least over a given frequency range) and has no thermal noise contribution.

Of course, the non-ideal circuit elements utilized in practical embodiments of the present invention result in some thermal noise, although much less than that of a passive resistor. By utilizing a field-effect-transistor (FET) amplifier the input and output of which respectively sense the port voltage and generate the port current, ideal performance is approximated. Thus, active circuits operating at room temperatures can be made to approximate resistors operating at cryogenic temperatures.

In keeping with the present invention, embodiments are disclosed which utilize dual interconnected and single transformers. Circuits for simulating both positive and negative low-noise temperature resistors are disclosed. In order to distinguish the positive low-noise simulated resistors from conventional resistors, the term "absorbor" has been coined, with the ending "or" to conform to the ending in "resistor". Similarly, for the negative low-noise resistors, the term "desorbor" is employed. In both instances, the "absorbance" and "desorbance" of the circuits of the invention have the traditional dimension of ohms.

BRIEF DESCRIPTION OF DRAWINGS

The above-mentioned and other features and objects of the present invention will become more apparent by reference to the following description taken in conjunction with the accompanying drawings, wherein like reference numerals denote like elements, and in which:

FIG. 4 is a schematic diagram of another embodiment of the present invention utilizing a single transformer;

FIG. 5 is a schematic diagram of a simplified impedance matching circuit utilizing the embodiment of FIG. 3; and FIG. 6 is a schematic diagram of a circuit which is equivalent to the circuit of FIG. 5 under a certain operating regime.

BEST MODE FOR CARRYING OUT THE INVENTION

Figure 1:
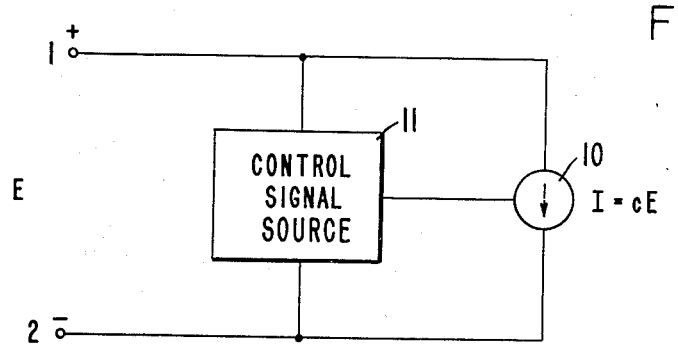
FIG. 1 is a simplified block diagram of a single-port network, for the purpose of illustrating an ideal simulated resistance.

In FIG. 1, there is shown for the purposes of explanation a single-port active network which simulates a passive resistor. The circuit of FIG. 1 comprises an ideal current source 10 and an ideal voltage-responsive control signal source 11 connected in parallel between the network terminals 1 and 2. (As ideal lossless circuit elements, both control signal source 11 and current source 10 are characterized by zero thermal noise). Voltage-responsive control signal source 11 generates a control signal which is proportional to the voltage E appearing across terminals 1-2. This control signal, in turn, controls the output of the current source 10, which output current I is equal to cE, where c is the constant of proportionality. Thus, the current I flowing through the network terminals 1-2 is $I=cE$.

It is seen that the equation describing the circuit of FIG. 1 is exactly the equation for the current flow through an ordinary resistor given by Ohm's Law with the conductance G (i.e. 1/R) having been replaced by the constant of proportionality c. As mentioned hereinabove, since the network of FIG. 1 is assumed to be composed of ideal circuit elements, its noise voltage output is zero. From a theoretical standpoint therefore, it is seen that it is possible to realize a resistor by means of active circuit elements and that the resulting resistor has the property of zero thermal noise.

As a practical matter, of course, it is not possible to realize the circuit of FIG. 1 with perfect circuit elements. All practical circuits are characterized by finite internal resistances and concomitant thermal noise, and in most cases by inherent bandwidth limitations. To the extent that the circuits described hereinafter employ non-ideal circuit elements, so too will the resulting circuits depart from ideal. Because of the particular suitabilities of field-effect-transistors (FETs), the embodiments described hereinbelow will be illustrated utilizing FETs as the active circuit elements. It is understood, however, that other amplifying devices having equally suitable characteristics may be employed in many cases.

Figure 2:
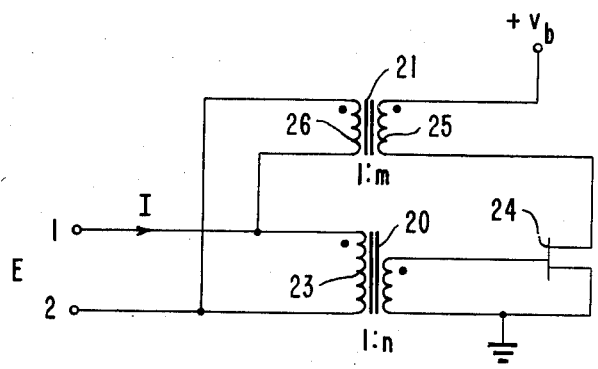
FIG. 2 is a schematic diagram of a first embodiment of the present invention which simulates a positive resistor.

Referring more specifically to the schematic diagram of FIG. 2, there is shown a two-transformer embodiment of the present invention. In FIG. 2 a first transformer 20 having a turns ratio of 1:n is provided with its input winding 23 connected to the network terminals 1 and 2. The secondary of transformer 20 is connected between the source and gate electrodes of a field effect transistor 24 with the source electrode also being connected to ground. A second transformer 21 having a turns ratio of m:1 is also provided. The primary winding 25 of transformer 21 is connected between a source of DC potential $V_b$ and the drain electrode FET 24. The secondary winding 26 of transformer 21 is connected in parallel with the primary winding of feedback transformer 20 and across the network terminals 1 and 2. The DC return path for bias voltage $V_b$ is provided by means of the common ground.

If, as in FIG. 1, the voltage across terminals 1 and 2 of the circuit is defined as E, and the circuit current as I, then an analysis of the circuit operation of FIG. 2 yields a value for the absorbance, or equivalent resistance looking into terminals 1-2 of:

$$R_{eq}=A=1/(g_m nm) \qquad [2]$$

where $g_m$ is the mutual transconductance of the field effect transistor 24. From Equation [2] it is seen that by making n equal to 1/m the equivalent resistance (absorbance) is equal to the reciprocal of the trans-conductance of FET 24. By varying the turns ratio of transformers 20 and 21 one can obtain a wide range of equivalent resistance values for the circuit depicted in FIG. 2.

In order to analyze the noise contribution, or more accurately, the thermal noise contribution of the circuit of FIG. 2, it is convenient to assume an open circuit condition at terminals 1-2. It is then found that the open-circuit noise voltage can be expressed as:

$$e_n^2 = 4kT_o B R_n/n^2 \qquad [3]$$

where $T_o$ is the ambivent temperature, and where the noise resistance $R_n$ depends upon the particular FET, but for a typical P-channel FET is approximately:

$$R_n \approx 0.6/g_{max}. \qquad [4]$$

Substituting, $$e_n^2 = (4kT_o B/n^2)(0.6/g_{max}). \qquad [5]$$

And by operating the circuit, as shown with substantially zero gate bias voltage $g_m = g_{max}$ and from Equation [2], $$e_n^2 = 4kT_o B(0.6m/n)A. \qquad [6]$$

The equivalent noise temperature of the simulated resistor (absorber) of FIG. 2 is therefore:

$$T_{eq} = (0.6 T_o m/n). \qquad [7]$$

Thus, the circuit of FIG. 2 simulates a resistor having an absorbance and effective temperature which are independently controllable.

Figure 3:
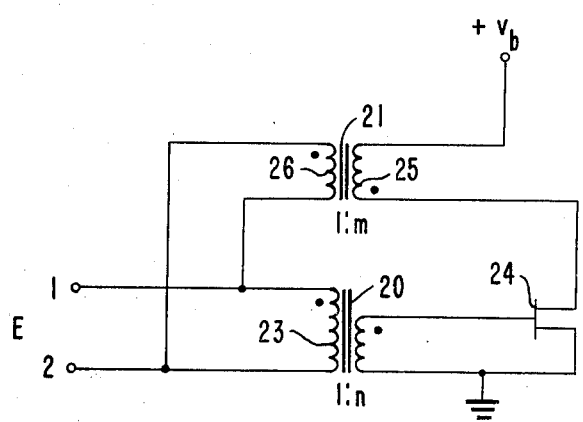
FIG. 3 is a schematic diagram of a second embodiment of the present invention which simulates a negative resistor.

Referring now to the schematic diagram of FIG. 3 there is shown a modification of the two-transformer circuit of FIG. 2 which simulates a "desorber" or negative resistance. The reference numerals from the embodiment of FIG. 2 have been carried over to FIG. 3 to designate like circuit elements. The circuit of FIG. 3 is identical to that of FIG. 2 with the exception that the interconnections to the primary of transformer 21 have been reversed so that the effective turns ratio is $-m{:}1$. As a result of this circuit change, the resistance $R_{eq}$ looking into terminals 1–2 is negative and is given by the equation:

$$R_{eq} = A = -(1/g_m nm). \qquad [8]$$

The output noise character of the negative resistance circuit of FIG. 3 is also similar to that given in Equation [6]. Thus, for the embodiment of FIG. 3:

$$e_n^2 = 4kT_o B(0.6m/n) [A]. \qquad [9]$$

The above equation takes into consideration the noise contribution of FET 24 but, as before, omits the noise contribution due to the non-ideal transformers 20 and 21. It is possible and in some cases perhaps more convenient, to reverse the connection to one of the other windings of either transformer 20 or 21. The same result can be achieved in this manner. That is, a circuit which simulates a negative resistance can be obtained by other transformer interconnection reversals.

Although transformers 20 and 21 have been illustrated as comprising two separate cores and their associated windings, in other cases a single transformer having but a single pair of windings can be employed with a modest sacrifice in circuit operating flexibility. Such a circuit is depicted in the schematic diagram of FIG. 4. In FIG. 4 a single transformer 40 having a turns ratio of 1:n is connected with its primary 41 connected through a blocking capacitor 42 to network terminals 1' and 2'. The secondary winding 42 of transformer 40 is connected between the gate and source electrodes of FET 44. The drain electrode of FET 44 is connected to the junction formed by the interconnection of primary winding 41 and blocking capacitor 42. Again, a biasing source shown as $V_b$ is provided at the other end of primary winding 41 with the return path being provided at the source electrode of FET 44 by means of common ground termination.

The equation for the effective resistance of the one-transformer embodiment of FIG. 4 is:

$$R_{eq} = A = 1/g_m n. \qquad [10]$$

And the noise voltage is:

$$e_n^2 = 4kT_o B(0.6A/n), \qquad [11]$$

again neglecting the resistance of the transformer windings.

In applicant's co-pending application Ser. No. 929,582, filed July 31, 1978, now U.S. Pat. No. 4,180,786, a practical circuit is disclosed for impedance matching a signal-generating transducer to a signal-processing amplifier while substantially maintaining both the original signal-to-noise ratio and original signal amplitudes. Such a circuit is shown somewhat simplified, in the schematic diagram of FIG. 5.

In FIG. 5 a load 50 which can comprise a utilization device such as an amplifier, for example, is coupled to a voltage source 51, such as a transducer, by means of a section of transmission line 52. The signal source 51 is shown as comprising a signal voltage source 53, noise voltage source 54 and source impedance 55 connected in series across the input terminals of the transmission line 52. At the load end of the circuit, a load resistor 56 and its equivalent noise voltage source 57 are serially connected together with a negative absorbor circuit 58 across the transmission line terminals. In accordance with a preferred mode of operation of the circuit of FIG. 5, the value of the load resistance 56 is made twice the value of the input resistance and twice the value of the characteristic impedance of transmission line 52. That is:

$$R_L = 2Z_o = 2R_s \qquad [12]$$

The negative absorbor 58 provides a negative low-noise resistance of a value A which is made equal to the magnitude of the source resistance $R_S$ and also to the magnitude of the transmission line characteristic impedance $Z_o$. Expressed mathematically, the value of the negative absorbance is:

$$A = R_s = Z_o \qquad [13]$$

Summarizing a low-noise resistance can be generally defined as a resistance having an associated noise voltage not exceeding approximately 50 percent of the noise voltage associated with a conventional (i.e. passive) resistor having the same resistance value. An "absorbor" such as depicted in FIGS. 2 or 4, uses a power source and a sensing means to create a out-of-phase copy of an incoming signal which, when combined with the incoming signal, cancels the energy content of the incoming signal. As mentioned hereinabove, an absorber emits noise voltages only to the extent that it is not perfect. The negative absorbor, or "desorbor" such as that shown in FIG. 3, uses a power source and a sensing means to create a in-phase copy of an incoming signal, which when combined with the incoming signal, increases the energy content of the incoming signal. It is also noted that a desorber also emits noise only to the extent that it is not perfect.

With these definitions in mind, the negative absorbor or "desorbor" 58 of FIG. 5 can comprise the device of FIG. 3 or one of the devices depicted in either applicant's co-pending application Ser. No. 838,511 filed Oct. 3, 1977 or Ser. No. 881,296, filed Feb. 27, 1978. Examples of specific circuits which may be employed for the negative absorber 58 are shown in these applications. For the purposes of discussion however, it is assumed that negative absorbor 58 comprises the circuit shown hereinabove in FIG. 3. It is assumed that negative absorbor 58 generates a small noise voltage compared to that of a noise source 57 associated with load resistor $R_L$. When this assumption is made, the impedance $Z_L$ of the overall load portion of FIG. 5 is given by:

$$Z_L = R_L - A. \qquad [14]$$

Substituting Equations [12] and [13] into Equation [14] yields:

$$Z_L = 2Z_o - Z_o = Z_o$$

Thus the impedance seen by transmission line section 52 is equal to its characteristic impedance and therefore, the transmission line is properly terminated with a matched load.

In the above mentioned co-pending application Ser. No. 929,582 it is also shown that the signal voltage across the input to load 50 under the conditions described above is equal to S. That is, the signal voltage at the input to the load is undiminished in amplitude from the original signal voltage S.

In the circuit of FIG. 5 there are three sources of noise to consider, namely, that of the signal source 51 represented by noise source 54, the load resistor 56 represented by noise voltage source 57 and that of the negative absorbor 58. The noise voltage appearing at the input to load 50 can be expressed as:

$$E = \frac{R_L V_S}{R_s + R_L - A} = V_s \quad [16]$$

Thus, all of the noise voltage $V_s$ of signal source 51 appears at the input to load 50. It can also be shown that the noise voltage due to negative absorbor 58 also appears at the input to load 50; however, the noise of load resistor 56 represented by noise source 57 does not appear at all. The voltage $V_L$ of the load resistor noise source 57 is exactly cancelled by the voltage appearing across load resistor 56 due to the noise current from the noise source 54. These relationships again, are derived in the above mentioned co-pending application, and for the sake of simplicity, are not duplicated herein.

When these factors are taken into consideration the circuit of FIG. 5 can be redrawn as shown in FIG. 6. The resulting circuit comprises a load 50 represented by a dashed box and an equivalent load resistor 56. Feeding load resistor 56 is the serial combination of the signal voltage source S, its input resistance $R_s$ and the negative absorbor 58. If, as postulated, the magnitude of the input resistor 55 and the absorbor 58 are equal and opposite, then the circuit further reduces to a signal source of diminishingly small internal impedance feeding the load resistance 56. The signal voltage source 53 is, in its ideal case a signal generator of very low impedance (its impedance having been represented by $R_S$). Thus, it is seen that the entire signal voltage S is applied across the load resistor $R_L$, while the very low impedance of the signal voltage source 53 effectively short-circuits the load resistor thereby effectively short-circuiting the voltage noise of the resistor $V_L$.

It is seen then that the circuit of FIG. 5 and its simplified equivalent of FIG. 6 not only provides a matched load to its signal source 51 and the transmission line 52 and does this with minimum degradation of the signal-to-noise power ratio, but it also transmits the signal voltage to the load undiminished in amplitude.

In all cases, it is understood that the above-described embodiments are merely illustrative of but a small number of the many specific embodiments which can represent applications of the principles of the present invention. Numerous and various other arrangements can be readily devised in accordance with these principles by those skilled in the art without departing from the spirit and scope of the present invention.

I claim:

1. A two-terminal network for simulating a resistance comprising:
   at least one transformer having a first and second winding;
   a field effect transistor having at least a source, drain and gate electrodes;
   first means for coupling one of said network terminals to one side of said first winding of said transformer;
   second means for coupling the other side of said first winding of said transformer to the other of said network terminals;
   third means for coupling said source and gate electrodes of said field effect transistor across said second winding of said transformer; and
   fourth means for coupling said drain electrode of said field effect transistor to said one side of said first winding of said transformer.

2. The network according to claim 1 wherein said second means includes means for applying a DC bias voltage to said field effect transistor.

3. The network according to claim 1 wherein said first means includes a blocking capacitor.

4. The network according to claim 1 wherein the resistance simulated by said network has a value which is inversely proportional to the product of the mutual transconductance of said field effect transistor and to the turns ratio of said transformer.

5. A two-terminal network for simulating a resistance comprising:
   a first transformer having an input and output winding and an input-to-output turns ratio of 1/n;
   a second transformer having an input and output winding and an input-to-output turns ratio of m;
   a field effect transistor having at least a source, drain and gate electrodes;
   first means for coupling said input winding of said first transformer in parallel to said output winding of said second transformer to form said network terminals.
   second means for coupling said secondary of said first transformer between said source and gate electrodes of said field effect transistor;
   third means for coupling one side of said primary of said second transformer to said drain electrode of said field effect transistor; and
   fourth means for applying a DC biasing potential to said other side of said primary winding of said second transformer.

6. The network according to claim 5 wherein the equivalent resistance across said network terminals is inversely proportional to the product of n, m and the mutual transconductance of said field effect transistor.

* * * * *